US010782352B2

(12) United States Patent
Elder et al.

(10) Patent No.: US 10,782,352 B2
(45) Date of Patent: Sep. 22, 2020

(54) PORTABLE TEST METER WITH BACKLIGHT BATTERY DEPLETION MONITORING

(71) Applicant: Cilag GmbH International, Zug (CH)

(72) Inventors: David Elder, Inverness (GB); Brian Guthrie, Inverness (GB); Malcolm Hamer, Inverness (GB)

(73) Assignee: LifeScan IP Holdings, LLC, Malvern, PA (US)

( * ) Notice: Subject to any disclaimer, the term of this patent is extended or adjusted under 35 U.S.C. 154(b) by 357 days.

(21) Appl. No.: 15/962,061

(22) Filed: Apr. 25, 2018

(65) Prior Publication Data

US 2019/0331735 A1 Oct. 31, 2019

(51) Int. Cl.
*G01R 31/3835* (2019.01)
*G01R 31/28* (2006.01)
*G02F 1/13357* (2006.01)
*G01R 31/385* (2019.01)

(52) U.S. Cl.
CPC ..... *G01R 31/3835* (2019.01); *G01R 31/2882* (2013.01); *G01R 31/385* (2019.01); *G02F 1/133602* (2013.01)

(58) Field of Classification Search
CPC .............. G01R 31/3835; G01R 31/385; G01R 31/2882; G02F 1/133602
See application file for complete search history.

(56) References Cited

U.S. PATENT DOCUMENTS

| | | | | |
|---|---|---|---|---|
| 4,709,202 A | * | 11/1987 | Koenck | H02J 7/0071 320/112 |
| 4,845,419 A | * | 7/1989 | Hacker | H02J 7/0077 320/136 |
| 6,992,487 B1 | * | 1/2006 | Steinke | H01M 10/425 324/426 |
| 7,196,496 B2 | * | 3/2007 | Yamada | G01R 31/3648 320/149 |
| 8,709,232 B2 | | 4/2014 | Matzinger | |
| 10,594,145 B1 | * | 3/2020 | Wang | H02J 7/0031 |
| 2006/0139003 A1 | * | 6/2006 | Fischer | H01M 10/4257 320/132 |
| 2007/0040449 A1 | * | 2/2007 | Spurlin | A61M 5/14244 307/64 |

(Continued)

*Primary Examiner* — Manuel L Barbee
*Assistant Examiner* — Raymond L Nimox

(57) ABSTRACT

A test meter and related method for monitoring the condition of a backlight battery of the meter in which the meter includes a housing, controller, display with backlight and a battery monitoring circuit. An off-time of the meter is measured and compared to a predetermined recovery time of the backlight battery. If the off-time of the meter is greater than the predetermined recovery time of the backlight battery, a voltage of the backlight battery is measured at a predetermined time after energizing the backlight and compared to a first predetermined voltage in excess of a threshold voltage of the backlight battery. If the measured voltage is less than the first predetermined voltage, the measured voltage is compared to a second predetermined voltage between the first predetermined voltage and the threshold voltage. A battery depletion warning is displayed if the measured voltage is less than the second predetermined voltage.

20 Claims, 8 Drawing Sheets

(56) References Cited

U.S. PATENT DOCUMENTS

| | | | |
|---|---|---|---|
| 2009/0146826 A1* | 6/2009 | Gofman | H02J 7/0047 340/636.2 |
| 2011/0054282 A1* | 3/2011 | Nekoomaram | G01K 1/02 600/347 |
| 2011/0160665 A1* | 6/2011 | Rufer | G01R 31/382 604/131 |
| 2014/0059360 A1* | 2/2014 | Guthrie | G06F 1/3265 713/300 |
| 2015/0048836 A1* | 2/2015 | Guthrie | G06F 1/3265 324/427 |
| 2015/0168339 A1* | 6/2015 | Guthrie | G01N 33/48792 205/792 |

* cited by examiner

PORTABLE TEST METER WITH BACKLIGHT BATTERY DEPLETION MONITORING

TECHNICAL FIELD

This application is generally directed to the field of test meters and more specifically to a portable test meter used for periodic monitoring of a subject and a related method for monitoring depletion of a battery used in the portable test meter.

BACKGROUND

Handheld devices, such as portable test meters, generally require a display to communicate the results of test measurements to a user of the meter. For purposes of readability in low light conditions, such displays can include a backlight. Portable test meters that are compact, lightweight and long-lasting without the need for frequent battery exchange are desirable.

Some technologies, such as thin-film transistor (TFT) display technologies, offer enhanced color graphics that are desirable to users. However, these displays may be completely unreadable without a backlight, and therefore are not suited to use in a portable test meter that is to operate for weeks or months without battery exchange, because the backlight cannot be disabled in order to save power. Therefore, such displays that require constant backlighting are typically not utilized or considered for use in such portable test meters.

In addition, commonly used displays in test meters are passive liquid crystal displays (LCD), which are still legible even without an active backlight. Therefore, existing architectures for portable test meters do not account for the real problem encountered with portable test meters having TFT display screens, which require enhanced monitoring and management of the backlight subsystem to prevent unpredictable power loss to the test meter.

Further, commonly used battery depletion detection algorithms may only look at the battery voltage before startup. In such cases, the internal resistance of the battery, ion mobility and temperature effects are not considered. Such simple tests only work, however, for batteries that are subject to relatively small and steady current drain.

BRIEF DESCRIPTION OF THE DRAWINGS

So that the manner in which the features of the invention can be understood, a Detailed Description may be had by reference to certain embodiments, some of which are illustrated in the accompanying drawings. It is to be noted, however, that the drawings illustrate only certain embodiments and are therefore not to be considered limiting of its scope, for the scope of the disclosed subject matter encompasses other embodiments as well. The drawings are not necessarily to scale, emphasis generally being placed upon illustrating the features of certain embodiments. In the drawings, like numerals are used to indicate like parts throughout the various views.

DETAILED DESCRIPTION

Figure 1A:
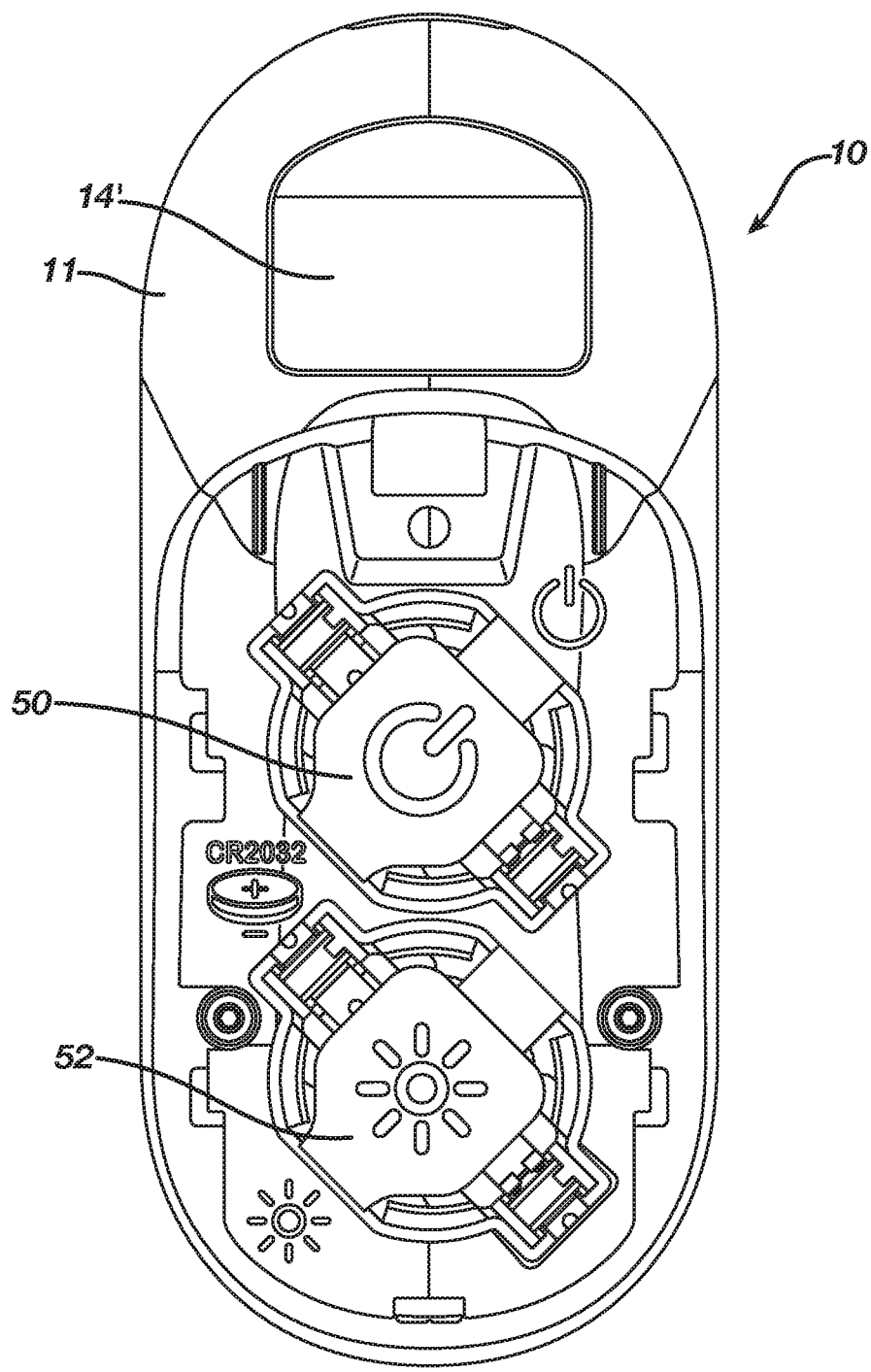
FIG. 1A depicts a back facing view of a portable test meter, partially broken away, in accordance with aspects set forth herein.

The following Detailed Description should be read with reference to the drawings, in which like elements in different drawings are identically numbered. The drawings, which are not necessarily to scale, depict selected embodiments and are not intended to limit the scope of the invention. The Detailed Description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used herein, the terms "about" or "approximately" for any numerical values or ranges indicate a suitable dimensional tolerance that allows the part or collection of components to function for its intended purpose as described herein. In addition, as used herein, the terms "patient," "host," "user," and "subject" refer to any human or animal subject and are not intended to limit the systems or methods to human use, although use of the subject techniques in a human patient represents a preferred embodiment.

The present disclosure relates, in part, to portable test meters such as those used to periodically measure the blood glucose level of a subject. Certain of these test meters are equipped with a main or primary battery that electrically powers a contained controller and a display of the test meter, along with any measurement subsystem, such as an electrochemical testing circuitry for blood glucose monitoring. For those portable test meters equipped with a TFT or similar form of display, there is a further requirement to power the backlight of the display. Accordingly, the test meter may further include a dedicated backlight battery, and allows for enhanced battery monitoring to facilitate replacement of a backlight battery prior to depletion. More specifically, the main battery may be used to power the controller, the display logic, and any measurement subsystems of the test meter, while the dedicated backlight battery may be used only to power the backlight. Such a configuration allows the use of a TFT display in the portable test meter, despite the problem that a TFT display requires a backlight to be visible. In one embodiment, the footprint of a portable test meter is reduced due to using a conventional coin cell battery as a dedicated backlight battery, because the coin cell battery, which would not normally be usable for backlighting, is operated in an unconventional manner as described herein.

In addition, coin cell batteries, such as CR2032 lithium batteries, have been commonly used in portable test meters, but are not rated for use with high power-draw components such as backlights. But the techniques described herein enable the use of these common batteries because these techniques take advantage of specific usage patterns of portable test meters, such as those that are used periodically to measure blood glucose of a diabetic patient.

Generally stated and according to an embodiment, a portable test meter is provided. The portable test meter includes means for monitoring a backlight battery, such as a battery monitoring circuit. The test meter includes a housing that retains a controller for, e.g., periodically measuring blood glucose levels of a subject. The test meter further includes a display, such as a TFT display having a backlight and a circuit for monitoring a dedicated backlight battery. Using the monitoring circuit, an off-time of the meter is measured and compared to a predetermined recovery time of the backlight battery. If the off-time of the meter is greater than the predetermined recovery time of the backlight battery, a voltage of the backlight battery is measured at a predetermined time after energizing the backlight and compared to a first predetermined voltage in excess of a threshold voltage of the backlight battery. If the measured voltage is less than the first predetermined voltage, the measured voltage is compared to a second predetermined voltage between the first predetermined voltage and the threshold voltage. A battery depletion warning is displayed if the measured voltage is less than the second predetermined voltage.

In another embodiment, disclosed herein is a method for monitoring the condition of a backlight battery for a portable test meter. The test meter includes a meter housing that retains a number of components including a controller and a display is provided on the meter housing. The display includes a TFT screen and a backlight. The backlight is powered by the backlight battery. According to the method, an off-time of the meter is measured and compared to a predetermined recovery time of the backlight battery. If the off-time of the meter is greater than the predetermined recovery time of the backlight battery, a voltage of the backlight battery is measured at a predetermined time after energizing the backlight and compared to a first predetermined voltage in excess of a threshold voltage of the backlight battery. If the measured voltage is less than the first predetermined voltage, the measured voltage is compared to a second predetermined voltage between the first predetermined voltage and the threshold voltage. A battery depletion warning is displayed if the measured voltage is less than the second predetermined voltage.

The above embodiments are intended to be merely examples. It will be readily apparent from the following discussion that other suitable embodiments are within the intended scope of the disclosed subject matter.

Specific working examples will now be described. Initially, with respect to FIGS. 1-6 a portable test meter, and a battery monitoring technique will be discussed.

Figure 1B:
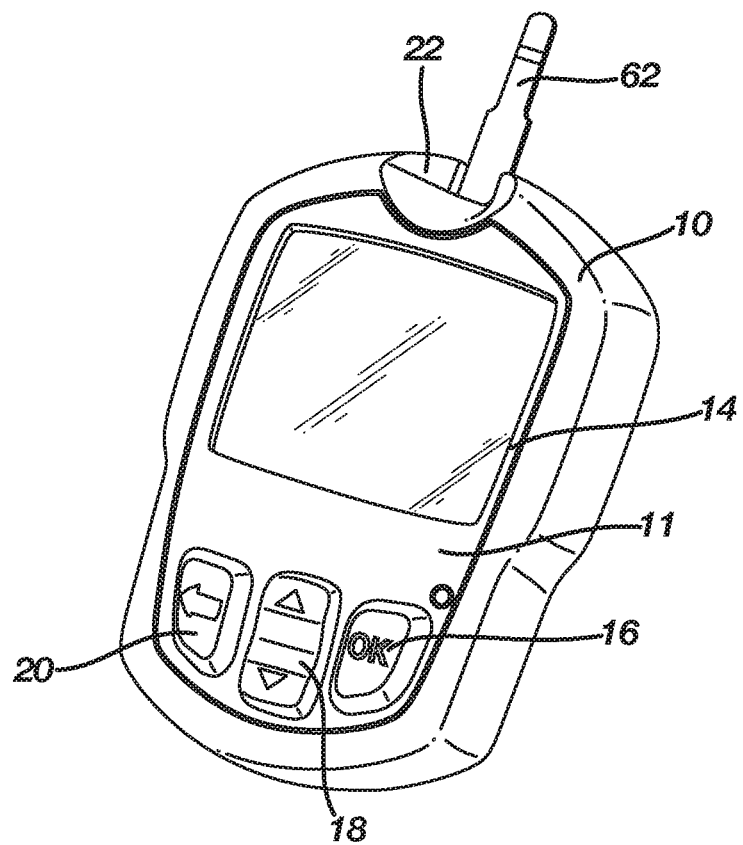
FIG. 1B depicts a front facing view of a portable test meter, in accordance with aspects set forth herein.

FIG. 1A depicts a back facing view of a portable test meter 10, which is defined by a meter housing 11 having an interior that is configured and sized to retain a plurality of components. These components include a controller 38 (see FIG. 2A), a main battery 50 and a backlight battery 52. As shown in FIG. 1B, a display 14 according to this embodiment includes a thin-film transistor (TFT) screen, as well as a backlight, that is disposed on the front facing side of a similar portable test meter 10'. In one operational example, the main battery 50 powers the controller 38 as well as the TFT display logic. Meanwhile, the backlight battery 52 powers the display backlight only.

Depending on the configuration, the backlight may be a light emitting diode (LED) or array of LEDs, wherein an array may include between 1 and 50 LEDs. In other embodiments, the backlight may be a fluorescent device, an electroluminescent device, an organic light-emitting diode (OLED), or any other light source that may be disposed within the housing 11 of the test meter 10, 10' of FIGS. 1A and 1B.

FIG. 1B illustrates a diabetes management system that includes a portable test meter 10' and a biosensor in the form of a glucose test strip 62. Although portable test meters 10, 10' have different physical appearances, they generally operate in the same manner. Note that the meter (meter unit) may be referred to as an analyte measurement and management unit, a glucose meter, a meter, and an analyte measurement device (not shown). In an embodiment, the meter unit may be combined with an insulin delivery device, an additional analyte testing device, and a drug delivery device. The meter unit may be connected to a remote computer or remote server via a cable or a suitable wireless technology such as, for example, GSM, CDMA, Bluetooth, WiFi and the like. Such management systems are described in greater detail in U.S. Pat. No. 8,709,232 B2, issued Apr. 29, 2014, and entitled "Analyte measurement technique and system," which is herein incorporated by reference in its entirety.

Referring back to FIG. 1B, the glucose meter or meter unit 10' is defined by a housing 11 having a plurality of user interface buttons (16, 18, and 20) disposed on a facing surface of the housing 11. The display 14 is provided in addition to a strip port opening 22 that is configured to receive a biosensor (test strip 62). The user interface buttons (16, 18, and 20) may be configured to allow the entry of data, navigation of menus, and execution of commands. The user interface button 18 may be in the form of a two way toggle switch. The number and orientation of the user interface buttons can assume various configurations wherein the three (3) interface buttons depicted are an example. Data may include values representative of analyte concentration, and/or information, which are related to the everyday lifestyle of an individual. Information, which is related to the everyday lifestyle, may include food intake, medication use, occurrence of health check-ups, and general health condition and exercise levels of an individual. The electronic components of the portable test meter 10, 10' may be disposed on a circuit board 34, FIG. 2B, that is disposed within the interior of the meter housing 11, 11'.

Figure 2A:
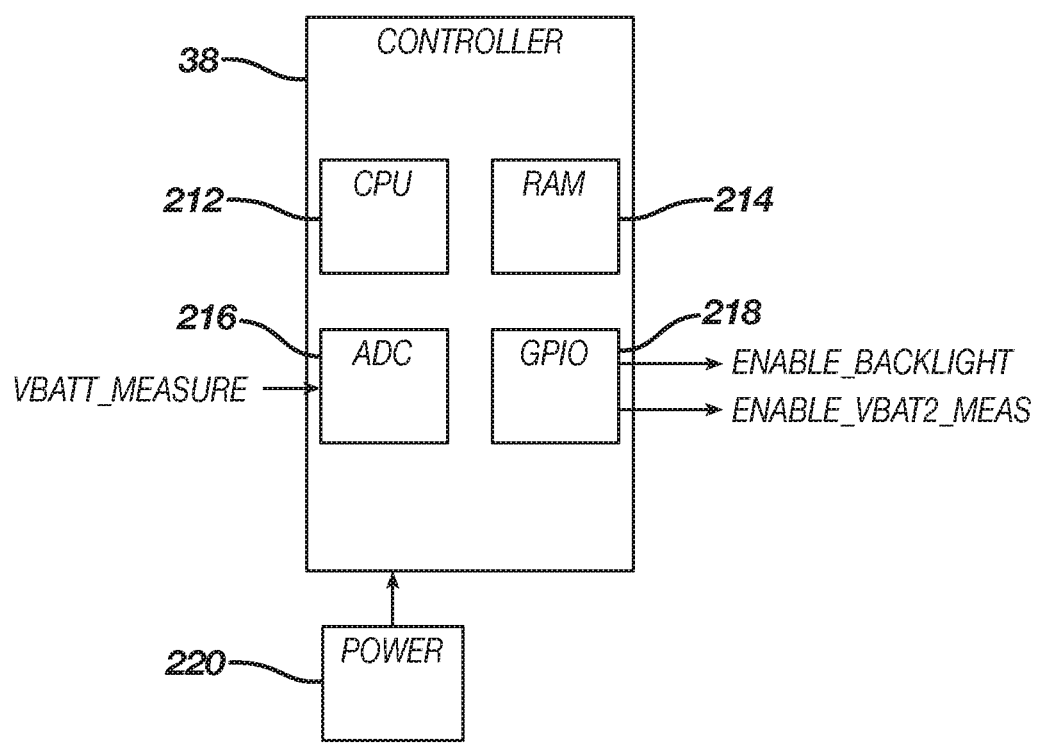
FIG. 2A is a block diagram of a controller used and powered in the portable test meter of FIG. 1A.

FIG. 2A depicts a partial block diagram of the portable test meter, showing a controller 38 connected to power 220. The controller 38 includes a central processing unit (CPU) 212, a random-access memory (RAM) 214, an analog-to-digital converter (ADC) 216 and a general purpose input/output (GPIO) 218. The ADC 216 is connected to the backlight battery monitoring circuit, and may be used to measure its voltage. The GPIO 218 may communicate with the display to turn on the backlight 60 (see FIG. 3), or may communicate with a battery monitoring circuit (see FIG. 4).

Figure 2B:
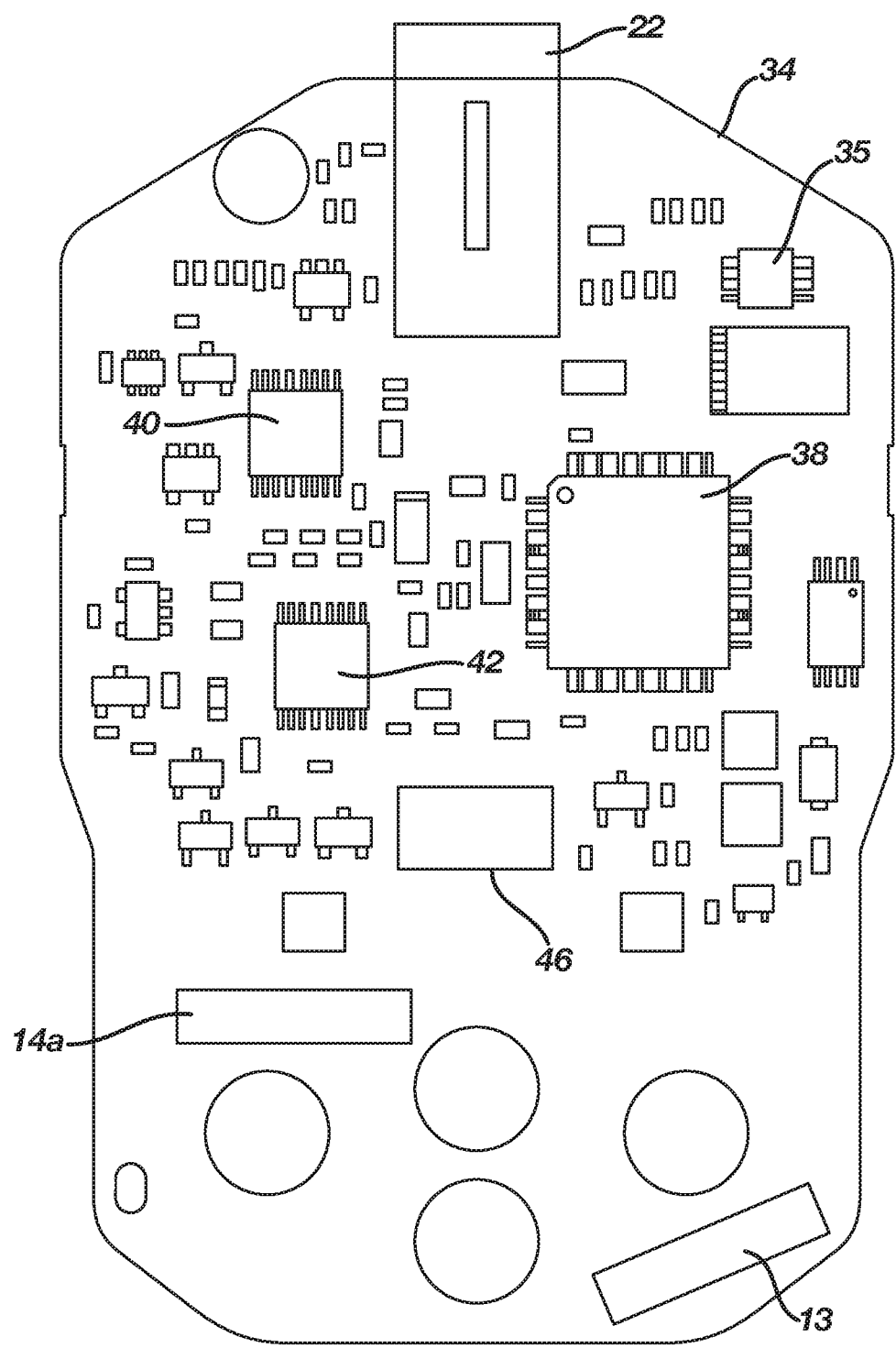
FIG. 2B is a plan view of a circuit board, including electrical components of the portable test meter of FIGS. 1A and 2A.

FIG. 2B illustrates (in simplified schematic) the electronic components disposed on a top surface of the circuit board 34 disposed within the interior of the test meter 10 of FIG. 1A. These electronic components include a strip port connector 22, an operational amplifier circuit 35, a controller 38, a display connector 14a, a non-volatile memory 40, a clock 42, and a first wireless module 46. On a bottom surface of the circuit board 34, the electronic components may include a battery connector (not shown) and a data port 13. The controller 38 may be electrically connected to the strip port connector 22, the operational amplifier circuit 35, the first wireless module 46, the display 14, the non-volatile memory 40, the clock 42, at least one battery, the data port 13, and the user interface buttons 16, 18, 20.

The operational amplifier circuit 35 may include two or more operational amplifiers configured to provide a portion of the potentiostat function and the current measurement function. The potentiostat function may refer to the application of test voltages between at least two electrodes of a test strip used in connection with the test meter. The current function may refer to the measurement of test currents resulting from the applied test voltage. The current measurement may be performed with a current-to-voltage converter. The controller 38 may be in the form of a mixed signal microprocessor (MSP) such as, for example, the Texas Instrument MSP 430. The TI-MSP 430 may be configured to also perform a portion of the potentiostat function and the current measurement function. In addition, the controller 38 may also include volatile and non-volatile memory. In another embodiment, many of the electronic components may be integrated with the controller in the form of an application specific integrated circuit (ASIC).

The strip port connector 22 may be configured to form an electrical connection to a test strip, such as the test strip 62. The display connector 14a may be configured to attach to the display 14. The display 14 may be in the form of a liquid crystal display for reporting measured glucose levels, and for facilitating entry of lifestyle related information using the interface buttons 16, 18, 20. More specifically and according to this embodiment, the display 14 includes a backlight. The data port 13 may accept a suitable connector attached to a connecting lead (not shown), thereby allowing the test meter 10 to be linked to an external device, such as a personal computer. The data port 13 may be any port that allows for transmission of data such as, for example, a serial, USB, or a parallel port. The clock 42 may be configured to keep current time related to the geographic region in which the user is located and also for measuring time and as later described in greater detail. The test meter may be configured to be electrically connected to a power supply such as, for example, at least one contained battery, as depicted according to FIG. 3.

Figure 3:
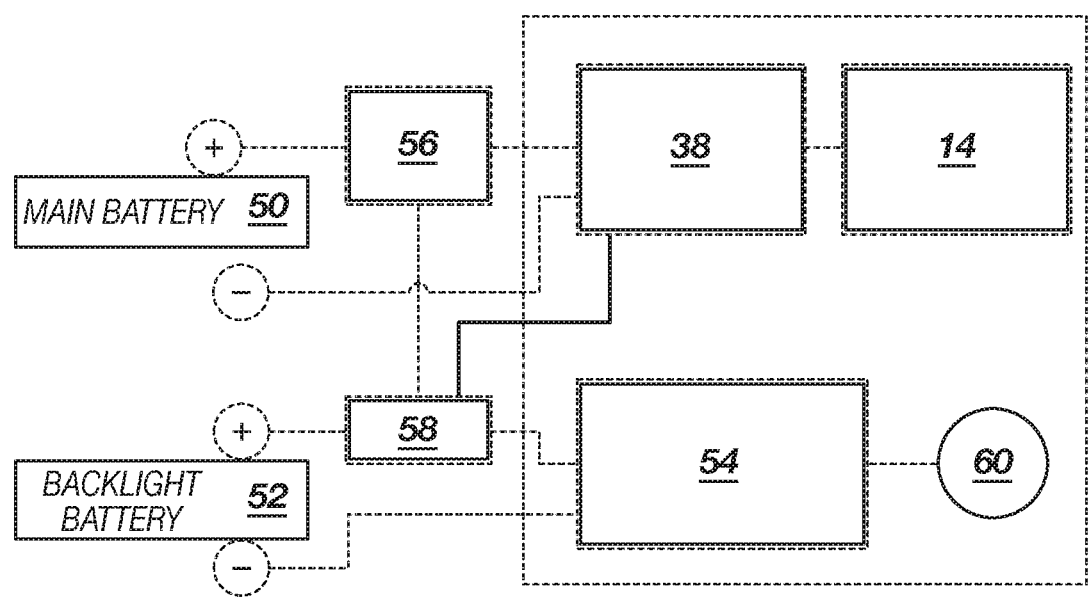
FIG. 3 depicts a schematic diagram of a backlight battery and main battery as connected within the portable test meter of FIG. 1A.

FIG. 3 schematically depicts further details of the power configuration for the test meter 10 of FIG. 1. In this configuration, a controller 38 is connected to a main battery 50 for supplying power to the controller 38. A backlight battery 52 is utilized to power a backlight 60 of the display 14 via a backlight drive circuit 54.

Figure 4:
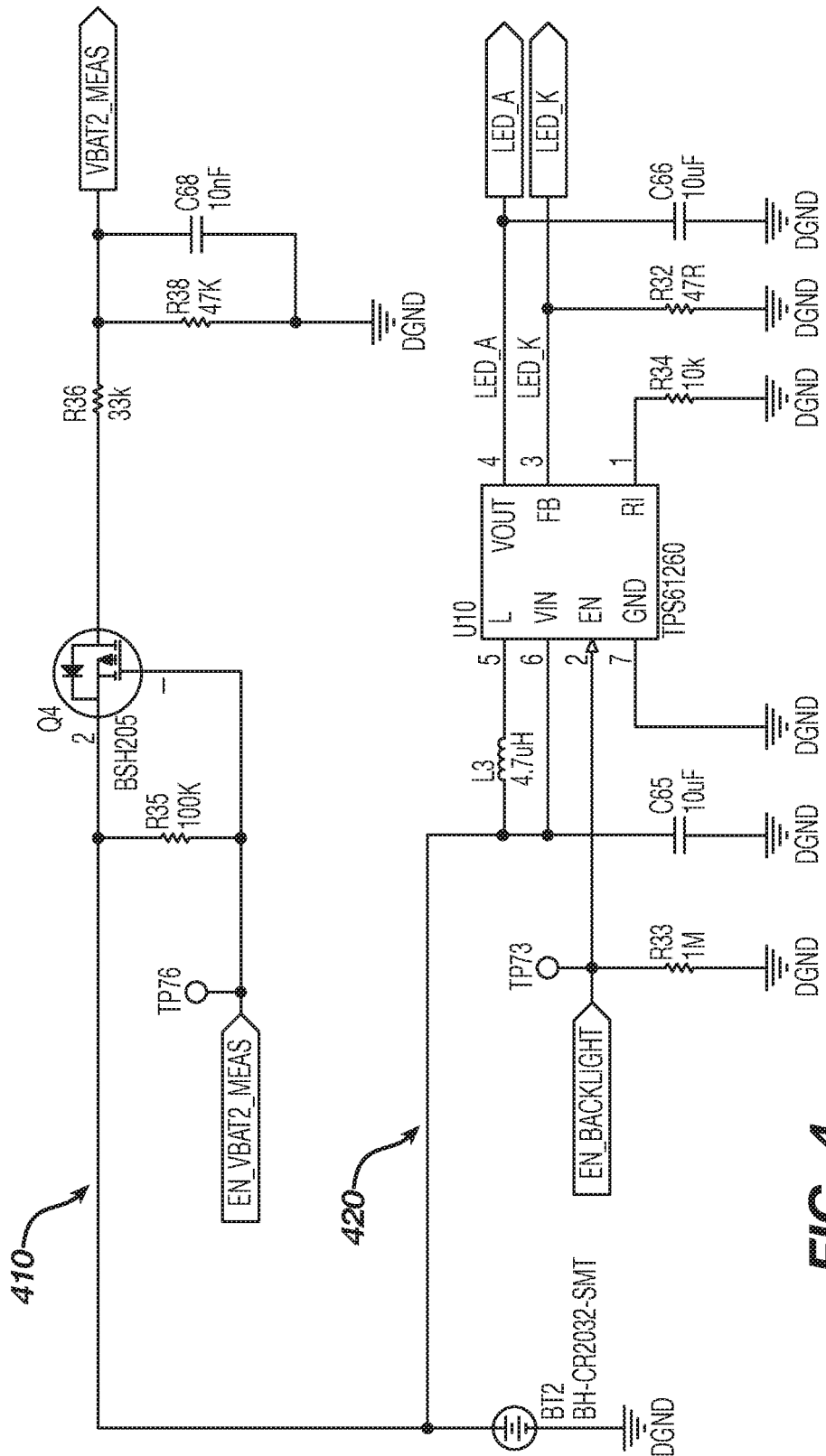
FIG. 4 depicts a backlight drive circuit with a battery monitoring circuit for use in a test meter and in accordance with aspects set forth herein.

FIG. 4 depicts a backlight drive circuit 410 according to an embodiment as used with a battery monitoring circuit 420. The exemplary backlight drive circuit 410 employs a switched-mode boost regulator operating in a constant current configuration. The drive circuit 410 outputs to the LED backlight through LED_A and LED_K. The LED current is controlled by a resistor, R32. In such a case, a reference voltage, for example, 500 mV, may be maintained at pin FB on U10, providing an LED drive current of approximately 10 mA. The battery monitoring circuit 420 measures the voltage VBAT2 through the analog to digital converter (ADC). For example, to facilitate the backlight battery measurement, the controller can pull signal EN_VBAT2_MEAS to a low potential, thus turning MOSFET Q4 on. This allows the voltage from BT2 to reach the potential divider created by R34/R38. The ratio of these two resistors divides the BT2 voltage down by a factor of 1.7, before feeding this voltage to the ADC. The divider ensures that the BT2 voltage does not saturate the ADC input.

Figure 5A:
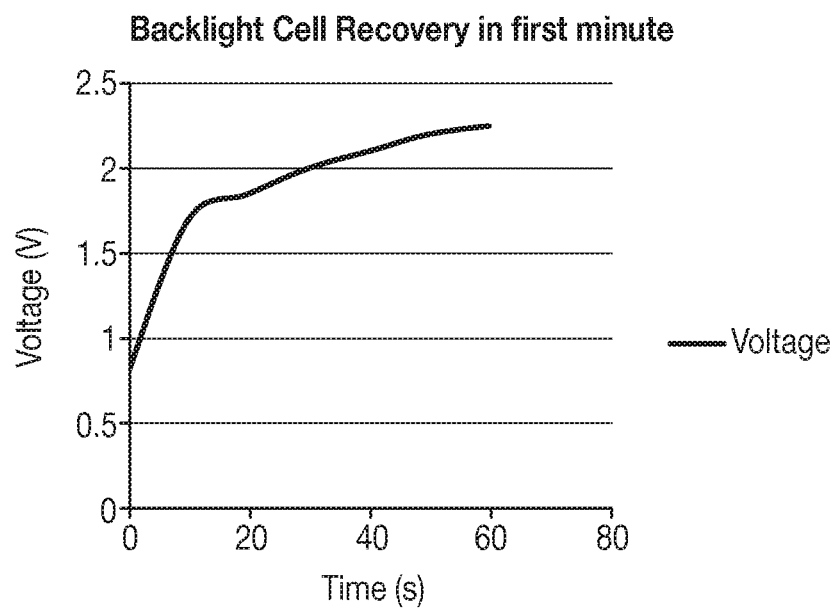
FIGS. 5A-5B depict voltage recovery characteristics of batteries intended for use as backlight batteries for a test meter, in accordance with aspects set forth herein.
Figure 5B:
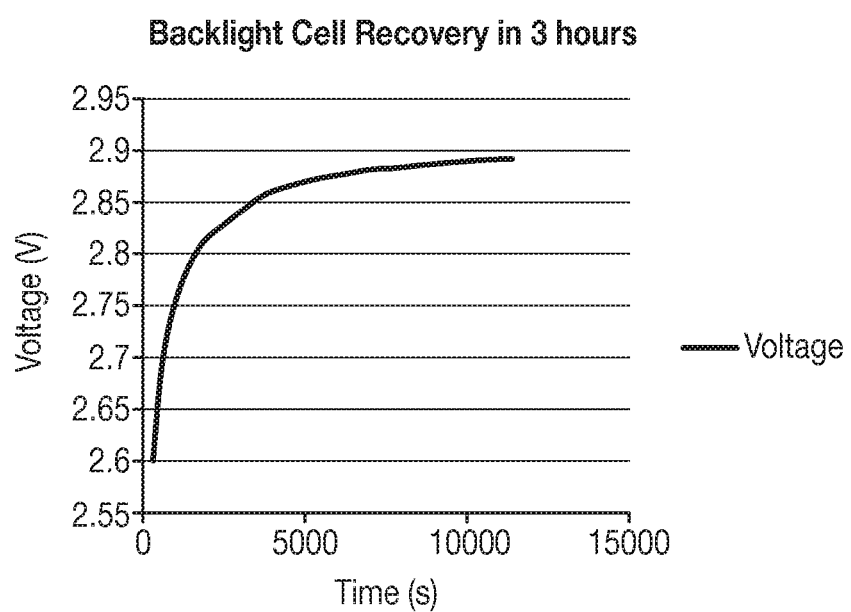

FIGS. 5A-5B depict electrochemical voltage recovery characteristics of lithium coin backlight batteries, in accordance with aspects set forth herein. For example, if the backlight battery is loaded to 0.8 V, when the load is removed, FIG. 5A shows that the voltage begins to recover to above 2 V after approximately 60 seconds. However, recovery to 99% of a nominal cell voltage of 3 V, for example, may take approximately 3 hours as shown in FIG. 5B.

For example, a specific battery model may be selected for use in the portable test meter as a backlight battery. Such a battery may be characterized through factory testing to determine the amount of time that the battery will take to return to electrochemical equilibrium after being drawn for a period of time typical of usage of the portable test meter. In the case of a portable glucose test meter that is typically used 3-4 times per day for about 2-5 minutes at a time, the battery cycling may be characterized for 5 minutes with full draw, with the time required for recovery determined.

Notably, a lithium coin battery displaying the characteristics of FIGS. 5A-5B would not be ideal for powering a backlight battery for a device that is operated continually and over a relatively long period of time. However, because a test meter such as a glucose meter is typically only used a few times a day during the testing process for relatively short periods, lithium coin batteries may be used as backlight batteries in such meters by employing monitoring techniques as described herein. These monitoring techniques enable detection of depleted batteries for timely replacement.

In addition to the recovery time characteristics, a battery may exhibit reduced voltage when stored at a temperature outside its normal operating range. In such a case, where the battery is well below a nominal operating temperature, the techniques described herein may account for the temperature being out of the operating range by suppressing a battery depletion message during such a cycle.

Figure 6:
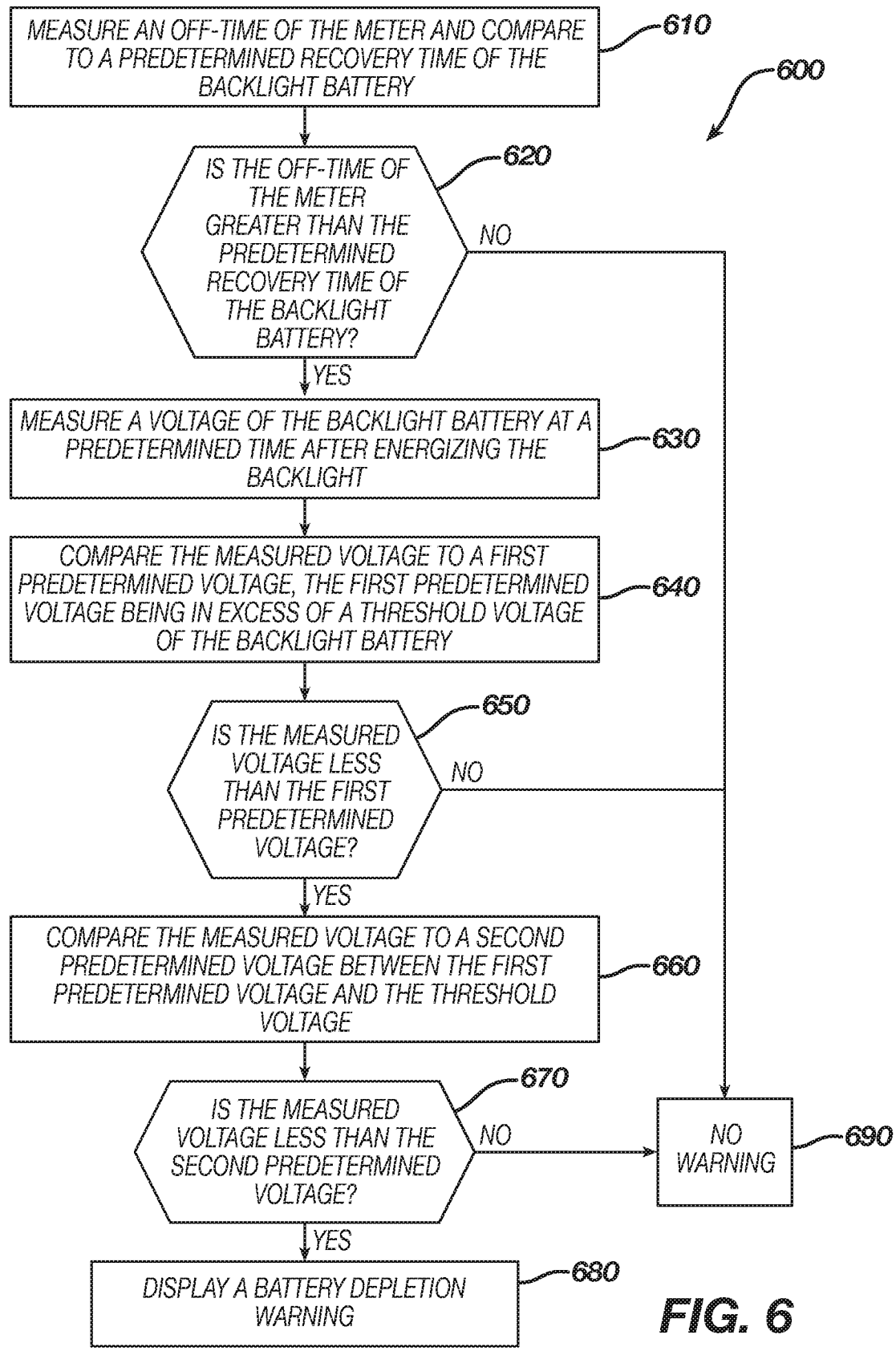
FIG. 6 depicts a method for monitoring the condition of a backlight battery, such as those having characteristics depicted in FIGS. 5A-5B for use in a portable test meter, in accordance with aspects set forth herein.

FIG. 6 depicts a method 600 for monitoring the condition of the backlight battery 52 of the portable test meter 10, 10' of FIG. 1A or 1B when using a backlight battery having characteristics similar to those of FIGS. 5A and 5B. As noted, a test meter such as a glucose meter involves periodic measurements taken over the course of a 24 hour period based on meals and other events (exercise, sleep, etc.). Accordingly, the test meter will not be powered at all times wherein a glucose measurement can be obtained several times in a given 24-hour period in which a measurement may often take less than a minute. For purposes of the invention and determining the depletion of the backlight battery, it has been determined that the off time of the test meter is a significant factor that can be utilized for determining whether the backlight battery is depleted. In describing the method 600, a specific working example will be given for illustration purposes only.

In one embodiment, the method 600 at block 610 measures an off-time of the meter and compares the measured off-time of the meter to a predetermined recovery time of the backlight battery. For instance, the controller 38 may store backlight usage records to the nonvolatile memory. In the specific working example for illustration purposes that will be followed here with respect to FIG. 6, a record may indicate that the last time the backlight was energized was at 1:08 pm on day X. Then, when the meter is next turned on, the meter may obtain the current system time from an onboard clock of the controller. In the specific working example, the current system time may be 5:28 pm on day X. Then, the controller can subtract from the current system time the previous energized time to determine the off-time, which in this specific working example would be 4 hours and 20 minutes.

In order to precisely gauge whether a contained battery of the test meter has been depleted, the measurement is most precise when the battery has been allowed to recover from periodic cycling. In such a case, the method 600 at block 620 determines if the off-time of the meter is greater than the predetermined recovery time of the backlight battery. In the specific working example, a lithium coin cell battery may require a time of 4 hours to recover, and thus, in this specific example, the controller can compare the actual off-time with the 4-hour recovery time, and proceed down the YES branch of block 620. If, instead, the battery has not been allowed to sufficiently recover for the full four hours, the method 600 at block 620 proceeds to block 690, and no warning message will be displayed. In such a case, the meter may proceed with the main meter routine, and allow a test, such as a blood glucose test, to be performed.

In other examples, a battery may require anywhere from 10 minutes to 12 hours for recovery. The recovery time for a specific battery model used in a specific test meter may be characterized, and an appropriate value for the recovery time may be thus predetermined. Characterization of the recovery time of the battery may be made by controlled testing using N battery replicates, and measuring the internal voltage of the battery using a voltage meter, as described with respect to FIGS. 5A-5B.

Continuing, the method 600 at block 630 turns on (energizes) the backlight of the test meter and measures a voltage of the backlight battery at a predetermined time after energizing the backlight. The predetermined time may be chosen to allow the backlight to fully energize prior to taking a measurement. In the specific working example, the battery monitoring circuit 410 can read the voltage after the predetermined time and the controller can store the voltage in the nonvolatile memory. The predetermined time may be chosen by controlled testing in which a high-speed voltage tester is used in a controlled environment to monitoring the backlight battery voltage during the first several seconds of operation of the backlight to determine how much time must pass for the voltage drop to stabilize.

Next, the method 600 at block 640 compares the measured voltage to a first predetermined voltage that is in excess of a threshold voltage of the backlight battery. The first predetermined voltage may be selected as a voltage that is high enough that there is little or no possibility that the backlight battery is near depletion. Conversely, the threshold voltage may be selected as the minimum possible voltage needed to energize the backlight. In one specific example, the threshold voltage may be 0.8 V, and the first predetermined voltage may be 2.5 V (the voltage of a new battery).

The method 600 at block 650 determines if the measured voltage is less than the first predetermined voltage. In the case where the measured voltage is greater than or equal to the first predetermined voltage, the method 600 proceeds to block 690, and no warning is displayed because the backlight battery is not close to being depleted. In one example, the first predetermined voltage may be set equal to the full voltage of a newly installed battery.

If the method 600 at block 650 determines that the measured voltage is less than the first threshold voltage, the method 600 continues to block 660 and compares the measured voltage to a second predetermined voltage, the second predetermined voltage being between the first predetermined voltage and the threshold voltage. The second predetermined voltage may be selected through controlled testing of N replicates of test meters and batteries (e.g., N=100). The second predetermined voltage represents the voltage at which the battery is close enough to depletion to require intervention by the user. For example, the second predetermined voltage may be determined through controlled testing to the point where a specific small number of typical meter tests, such as between one and five tests, may be run before the battery is fully depleted. In one example, the second predetermined voltage may be between 1.0 V and 1.2 V.

The method 600 at block 670 determines if the measured voltage is less than the second predetermined voltage. If the measured voltage is not less than the second predetermined voltage, then the method proceeds to block 690 and no warning is displayed.

Conversely, if the measured voltage is less than the second predetermined voltage, then the method proceeds to block 690 and the battery depletion warning or message is displayed on the meter. In one example, the battery depletion message may be displayed continuously on the meter as a low battery icon. In another example, the meter may require acknowledgement of the battery depletion warning before allowing a test to be performed. In a further example, the battery depletion warning may indicate the number of remaining test cycles for the meter. In still another example, the battery depletion warning may be escalated or repeated based on how few remaining typical tests may be performed.

In another embodiment, the method may measure a second voltage of the backlight battery at a second predetermined time. For example, the second measured voltage may be taken between 1 and 1,000 seconds after the first measured voltage. The second measured voltage may be used to determine the voltage drop of the battery that occurs during the predetermined time since energizing the backlight. As the backlight battery is depleted, upon each usage cycle, this voltage drop will become greater. In an example where a low capacity battery is used to power a backlight, such a battery may only be capable of powering the backlight for a specific duration before needing to be turned off for a recovery cycle. Thus, the meter can determine that the battery has been only temporarily depleted, rather than permanently depleted, if the backlight has been powered for longer than a specific time interval without being allowed to recover. Again, the acceptable on-time for such a battery can be characterized by controlled testing of N replicate meters with batteries, and Notably, the method 600 described above with respect to block 610 through block 680 typically takes place prior to a user of the meter conducting a test with the meter. Thus, the user may receive a backlight battery warning, and could at that time decide to forego conducting a test, such as a self-monitored blood glucose test, and immediately replace the backlight battery. In another example, the user may choose to conduct the test first and then subsequently replace the backlight battery. In a still further embodiment, based on the voltage level of the battery after the backlight has been energized, the controller can estimate the number of typical test cycles that may be remaining before the battery would be completely unable to light the screen, and provide a warning indicating how many remaining tests are possible before the battery is fully depleted.

In another embodiment, in addition to, or instead of, the battery depletion check described above, a so-called gas-gauging technique may be employed in which the cumulative energy used by the battery during its lifespan is tracked by measuring the voltage and current for each historical time interval that the meter is used starting from when a new battery is installed in the system. Such a technique used alone may be susceptible to errors, because a partially charged battery may be installed in the test meter. However, in conjunction with the other monitoring described above, such a technique could eliminate false positives or false negatives. For example, if a known new battery is installed (e.g., a smart battery having a specific identification code to indicate the manufacturer), then the meter could use the accumulated usage data to override a battery depletion warning.

While the invention has been described in terms of particular variations and illustrative figures, those of ordinary skill in the art will recognize that the invention is not limited to the variations or figures described. In addition, where methods and steps described above indicate certain events occurring in certain order, those of ordinary skill in the art will recognize that the ordering of certain steps may be modified and that such modifications are in accordance with the variations of the invention. Additionally, certain of the steps may be performed concurrently in a parallel process when possible, as well as performed sequentially as described above. Therefore, to the extent there are variations of the invention, which are within the spirit of the disclosure or equivalent to the inventions found in the claims, it is the intent that this patent will cover those variations as well.

To the extent that the claims recite the phrase "at least one of" in reference to a plurality of elements, this is intended to mean at least one or more of the listed elements, and is not limited to at least one of each element. For example, "at least one of an element A, element B, and element C," is intended to indicate element A alone, or element B alone, or element C alone, or any combination thereof. "At least one of element A, element B, and element C" is not intended to be limited to at least one of an element A, at least one of an element B, and at least one of an element C.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description set forth herein has been presented for purposes of illustration and description, but is not intended to be exhaustive or limited to the form disclosed. Many modifications and variations will be apparent to those of ordinary skill in the art without departing from the scope and spirit of the disclosure. The embodiment was chosen and described in order to best explain the principles of one or more aspects set forth herein and the practical application, and to enable others of ordinary skill in the art to understand one or more aspects as described herein for various embodiments with various modifications as are suited to the particular use contemplated.

What is claimed is:

1. A portable test meter comprising:
a meter housing;
a controller;
a display on the meter housing, the display comprising a thin-film transistor (TFT) screen and a backlight;
a backlight battery operatively connected to the backlight; and
a battery monitoring circuit operatively connected to the controller and the backlight battery, wherein the monitoring circuit:
measures an off-time of the meter and compares the measured off-time of the meter to a predetermined recovery time of the backlight battery;
if the off-time of the meter is greater than the predetermined recovery time of the backlight battery, measures a voltage of the backlight battery at a predetermined time after energizing the backlight and compares the measured voltage to a first predetermined voltage, the first predetermined voltage being in excess of a threshold voltage of the backlight battery;
if the measured voltage is less than the first predetermined voltage, compares the measured voltage to a second predetermined voltage, the second predetermined voltage being between the first predetermined voltage and the threshold voltage; and
displays a battery depletion warning if the measured voltage of the backlight battery is less than the second predetermined voltage.

2. The portable test meter of claim 1, wherein the backlight battery is configured for periodic loading for a power-on time followed by the predetermined recovery time, wherein loading of the backlight battery for longer than the power-on time reduces a battery internal voltage to below the threshold voltage of the backlight battery.

3. The portable test meter of claim 1, wherein the monitoring circuit is further configured to measure a second voltage of the backlight battery at a second predetermined time before energizing the backlight, and depending on the comparisons of the voltages of the backlight battery at the predetermined time and the second predetermined time, displaying the battery depletion warning on the screen of the test meter.

4. The portable test meter of claim 1, wherein the predetermined time is between 1 and 1,000 milliseconds.

5. The portable test meter of claim 1, wherein the monitoring circuit measures a cumulative power draw of the backlight battery during power-on operation of the backlight, and displays the battery depletion warning when the measured cumulative power draw is below a predetermined power rating of the backlight battery.

6. The portable test meter of claim 1, wherein the monitoring circuit measures a temperature of the backlight battery, and displays the battery depletion warning when the temperature is within a predetermined operating temperature range of the backlight battery.

7. The portable test meter of claim 1, wherein the backlight battery is a lithium primary battery.

8. The portable test meter of claim 1, further comprising a main battery operatively connected to the controller and the TFT screen, wherein the main battery and the backlight battery are of a same battery type.

9. A method for monitoring the condition of a backlight battery for a portable test meter, the test meter comprising a meter housing, a controller and a display on the meter housing, the display comprising a TFT screen and a backlight, the backlight being powered by the backlight battery, wherein the method comprises:

measuring an off-time of the test meter and determining if the off-time is greater than a predetermined recovery time of the backlight battery;

energizing the backlight;

if the off-time of the meter is greater than the predetermined recovery time of the backlight battery, measuring a voltage of the backlight battery at a predetermined time after energizing the backlight;

comparing the measured voltage to a first predetermined voltage, the first predetermined voltage being in excess of a threshold voltage of the backlight battery;

if the measured voltage is less than the first predetermined voltage, comparing the measured voltage to a second predetermined voltage, the second predetermined voltage being between the first predetermined voltage and the threshold voltage; and causing a battery depletion warning to be displayed on the TFT screen of the test meter if the measured voltage of the backlight battery is less than the second predetermined voltage.

10. The method of claim 9, further comprising periodically loading the backlight battery for a power-on time followed by the predetermined recovery time, wherein loading of the backlight battery for longer than the power-on time reduces an internal voltage of the backlight battery below the threshold voltage.

11. The method of claim 9, further comprising measuring a third voltage of the backlight battery before energizing the backlight.

12. The method of claim 1, further comprising displaying the battery depletion warning on the TFT screen of the test meter.

13. The method of claim 9, wherein the predetermined time is between 1 and 1,000 milliseconds.

14. The method of claim 9, further comprising measuring a cumulative power draw of the backlight battery during power-on operation of the backlight.

15. The method of claim 14, further comprising displaying the battery depletion warning when the measured cumulative power draw is below a predetermined power rating of the backlight battery.

16. The method of claim 9, further comprising measuring a temperature of the backlight battery.

17. The method of claim 16, further comprising displaying the battery depletion warning when the temperature is within a predetermined operating temperature range of the backlight battery.

18. The method of claim 9, wherein the backlight battery is a lithium primary battery.

19. The method of claim 9, further comprising a main battery operatively connected to the controller and the TFT screen, wherein the main battery and the backlight battery are of a same battery type.

20. The meter of claim 1, in which the meter is used to periodically measure blood glucose levels of a subject.

* * * * *

UNITED STATES PATENT AND TRADEMARK OFFICE
CERTIFICATE OF CORRECTION

PATENT NO. : 10,782,352 B2
APPLICATION NO. : 15/962061
DATED : September 22, 2020
INVENTOR(S) : David Elder et al.

Page 1 of 1

It is certified that error appears in the above-identified patent and that said Letters Patent is hereby corrected as shown below:

In the Claims

Column 12, Line 14, please change "The method of claim 1, further comprising displaying" to --The method of claim 9, further comprising displaying--

Signed and Sealed this
Twenty-second Day of November, 2022

Katherine Kelly Vidal
*Director of the United States Patent and Trademark Office*